(12) United States Patent
Gadre et al.

(10) Patent No.: US 10,593,543 B2
(45) Date of Patent: Mar. 17, 2020

(54) METHOD OF DEPOSITING DOPED AMORPHOUS SILICON FILMS WITH ENHANCED DEFECT CONTROL, REDUCED SUBSTRATE SENSITIVITY TO IN-FILM DEFECTS AND BUBBLE-FREE FILM GROWTH

(71) Applicant: Applied Materials, Inc., Santa Clara, CA (US)

(72) Inventors: Milind Gadre, Santa Clara, CA (US); Praket P. Jha, San Jose, CA (US); Deenesh Padhi, Sunnyvale, CA (US)

(73) Assignee: APPLIED MATERIALS, INC., Santa Clara ( * ) Notice: Subject to any disclaimer, the term of this patent is extended or adjusted under 35 U.S.C. 154(b) by 1 day.

(21) Appl. No.: 15/976,945

(22) Filed: May 11, 2018

(65) Prior Publication Data

US 2018/0350596 A1 Dec. 6, 2018

Related U.S. Application Data

(60) Provisional application No. 62/515,160, filed on Jun. 5, 2017.

(51) Int. Cl.
| | | |
|---|---|---|
| *H01L 21/00* | (2006.01) | |
| *H01L 21/02* | (2006.01) | |
| *C23C 16/24* | (2006.01) | |
| *C23C 16/46* | (2006.01) | |
| *C23C 16/509* | (2006.01) | |

(52) U.S. Cl.
CPC ........ *H01L 21/02532* (2013.01); *C23C 16/24* (2013.01); *C23C 16/46* (2013.01); *C23C 16/509* (2013.01); *H01L 21/0262* (2013.01); *H01L 21/02579* (2013.01); *H01L 21/02592* (2013.01)

(58) Field of Classification Search
CPC ......... H01L 21/02532; H01L 21/02579; H01L 21/02592; H01L 21/0262; C23C 16/00
USPC ....................................................... 438/482
See application file for complete search history.

(56) References Cited

U.S. PATENT DOCUMENTS

| | | |
|---|---|---|
| 5,389,570 A | 2/1995 | Shiozawa |
| 5,863,598 A * | 1/1999 | Venkatesan ........... C23C 16/045 148/DIG. 1 |
| 6,197,669 B1 * | 3/2001 | Twu ....................... C23C 16/24 257/E21.101 |
| 6,410,090 B1 | 6/2002 | Wang |

(Continued)

*Primary Examiner* — Vu A Vu
(74) *Attorney, Agent, or Firm* — Patterson + Sheridan LLP (57) ABSTRACT

Implementations described herein generally relate to the fabrication of integrated circuits and particularly to the deposition of a boron-doped amorphous silicon (a-Si) layers on a semiconductor substrate. In one implementation, a method is provided. The method comprises generating a pressure within a processing volume between 2 Torr and 60 Torr. The method further comprises heating a substrate in the processing volume to a temperature between 300 degrees Celsius and 550 degrees Celsius. The method further comprises flowing a silane-containing gas mixture into the processing volume having the substrate positioned therein. The method further comprises flowing a borane-containing gas mixture into the processing volume having the substrate positioned therein and depositing a boron-doped amorphous silicon layer on the substrate.

20 Claims, 4 Drawing Sheets

(56) References Cited

U.S. PATENT DOCUMENTS

| | | |
|---|---|---|
| 7,229,928 B2 * | 6/2007 | Baier .................. H01L 21/0337 |
| | | 257/E21.038 |
| 7,576,441 B2 | 8/2009 | Yin et al. |
| 8,278,726 B2 * | 10/2012 | Miles .................... B81B 3/0086 |
| | | 257/414 |
| 8,536,065 B2 | 9/2013 | Seamons et al. |
| 8,569,757 B2 * | 10/2013 | Fumitake .......... H01L 27/11568 |
| | | 257/57 |
| 8,846,525 B2 | 9/2014 | Rangarajan et al. |
| 8,993,454 B2 | 3/2015 | Seamons et al. |
| 2011/0133313 A1 | 6/2011 | Rangarajan et al. |
| 2011/0244142 A1 | 10/2011 | Cheng et al. |
| 2012/0202315 A1 | 8/2012 | Whitesell, III et al. |
| 2015/0235897 A1 | 8/2015 | Fu et al. |
| 2015/0279676 A1 | 10/2015 | Kim et al. |
| 2016/0172239 A1 | 6/2016 | Padhi et al. |
| 2017/0103893 A1 | 4/2017 | Kulshreshtha et al. |
| 2018/0076042 A1 | 3/2018 | Cheng et al. |

\* cited by examiner

METHOD OF DEPOSITING DOPED AMORPHOUS SILICON FILMS WITH ENHANCED DEFECT CONTROL, REDUCED SUBSTRATE SENSITIVITY TO IN-FILM DEFECTS AND BUBBLE-FREE FILM GROWTH

CROSS-REFERENCE TO RELATED APPLICATIONS

This application claims benefit of U.S. Provisional Patent Application Ser. No. 62/515,160, filed Jun. 5, 2017, which is incorporated herein by reference in its entirety.

BACKGROUND

Field

Implementations described herein generally relate to the fabrication of integrated circuits and particularly to the deposition of a boron-doped amorphous silicon (a-Si) layers on a semiconductor substrate.

Description of the Related Art

Semiconductor device geometries have dramatically decreased in size since such devices were first introduced several decades ago. Since then, integrated circuits have generally followed the two year/half-size rule (often called Moore's Law), which means that the number of devices that will fit on a chip doubles every two years. Today's fabrication plants are routinely producing devices having 0.35 µm and even 0.25 µm feature sizes, and tomorrow's plants soon will be producing devices having even smaller geometries. As device sizes continue to shrink, amorphous silicon thin films are used throughout many semiconductor integrated circuit manufacturing processes. Amorphous silicon thin films are used, for example, in the fabrication of three-dimensional devices, optoelectronic devices, gate electrodes, stack or trench capacitors, emitters, and contacts.

Current amorphous silicon thin films and methods for depositing these amorphous silicon thin films suffer from adhesion and bubbling problems. In addition, these amorphous silicon thin films and the related methods for deposition often lead to particle generation, which affects the quality of subsequently deposited films.

Therefore, there is a need in the art for an improved amorphous silicon layer and methods for depositing improved amorphous silicon layers.

SUMMARY

Implementations described herein generally relate to the fabrication of integrated circuits and particularly to the deposition of a boron-doped amorphous silicon (a-Si) layers on a semiconductor substrate. In one implementation, a method is provided. The method comprises generating a pressure within a processing volume between 2 Torr and 60 Torr. The method further comprises heating a substrate in the processing volume to a temperature between 300 degrees Celsius and 550 degrees Celsius. The method further comprises flowing a silane-containing gas mixture into the processing volume having the substrate positioned therein. The method further comprises flowing a borane-containing gas mixture into the processing volume having the substrate positioned therein and depositing a boron-doped amorphous silicon layer on the substrate.

In another implementation, a method is provided. The method comprises generating a pressure within a processing volume between 2 Torr and 60 Torr. The method further comprises heating a substrate in the processing volume to a temperature between 300 degrees Celsius and 550 degrees Celsius. The method further comprises flowing a first gas mixture comprising silane gas ($SiH_4$) into the processing volume having the substrate positioned therein. The method further comprises flowing a second gas mixture comprising diborane ($B_2H_6$) into the processing volume having the substrate positioned therein. The method further comprises depositing a boron-doped amorphous silicon layer on the substrate.

In yet another implementation, a method is provided. The method comprises generating a pressure within a processing volume between 2 Torr and 60 Torr. The method further comprises heating a substrate in the processing volume to a temperature between 300 degrees Celsius and 550 degrees Celsius. The substrate comprises a dielectric layer disposed over a surface of the substrate and conductive contacts disposed within the dielectric layer and separated from the dielectric layer by barrier layers. The method further comprises flowing a silane-containing gas mixture into the processing volume having the substrate positioned therein. The method further comprises flowing a borane-containing gas mixture into the processing volume and depositing a boron-doped amorphous silicon layer on the substrate.

BRIEF DESCRIPTION OF THE DRAWINGS

So that the manner in which the above-recited features of the present disclosure can be understood in detail, a more particular description of the implementations, briefly summarized above, may be had by reference to implementations, some of which are illustrated in the appended drawings. It is to be noted, however, that the appended drawings illustrate only typical implementations of this disclosure and are therefore not to be considered limiting of its scope, for the disclosure may admit to other equally effective implementations.

To facilitate understanding, identical reference numerals have been used, where possible, to designate identical elements that are common to the figures. It is contemplated that elements and features of one implementation may be beneficially incorporated in other implementations without further recitation.

DETAILED DESCRIPTION

The following disclosure describes films and techniques for deposition of boron-doped amorphous silicon (a-Si) layers on semiconductor substrates. Certain details are set forth in the following description and in FIGS. 1-3 to provide a thorough understanding of various implementations of the disclosure. Other details describing well-known structures and systems often associated with deposition and etching processes are not set forth in the following disclosure to avoid unnecessarily obscuring the description of the various implementations.

Many of the details, dimensions, angles and other features shown in the Figures are merely illustrative of particular implementations. Accordingly, other implementations can have other details, components, dimensions, angles and features without departing from the spirit or scope of the present disclosure. In addition, further implementations of the disclosure can be practiced without several of the details described below.

Implementations described herein will be described below in reference to a thermal CVD and/or plasma-enhanced chemical vapor deposition (PECVD) process that can be carried out using any suitable thin film deposition system. Examples of suitable systems include the CENTURA® systems which may use a DXZ® processing chamber, PRECISION 5000® systems, PRODUCER® systems, PRODUCER® GT™ systems, PRODUCER® XP Precision™ systems and PRODUCER® SE™ systems which are commercially available from Applied Materials, Inc., of Santa Clara, Calif. Other tools capable of performing thermal CVD and PECVD processes may also be adapted to benefit from the implementations described herein. In addition, any system enabling the thermal CVD and/or PECVD processes described herein can be used to advantage. The apparatus description described herein is illustrative and should not be construed or interpreted as limiting the scope of the implementations described herein.

Figure 1:
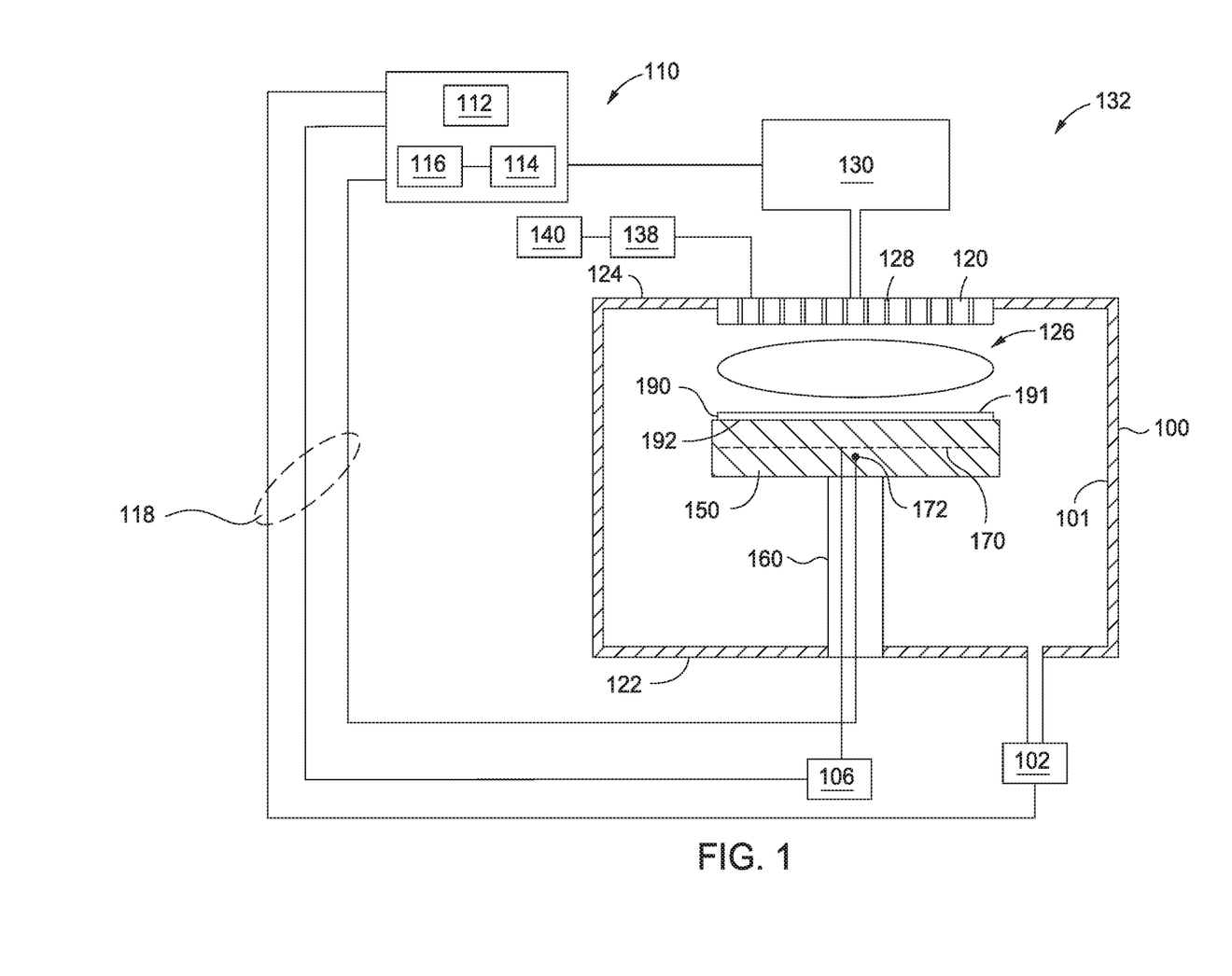
FIG. 1 depicts a schematic illustration of an apparatus that can be used for the practice of implementations described herein.

FIG. 1 depicts a schematic illustration of a substrate processing system 132 that can be used to perform boron-doped amorphous silicon layer deposition in accordance with implementations described herein. Examples of suitable systems include the CENTURA® systems which may use a DxZ™ processing chamber, PRECISION 5000® systems, PRODUCER™ systems, PRODUCER GT™ and the PRODUCER SE™ processing chambers which are commercially available from Applied Materials, Inc., Santa Clara, Calif. It is contemplated that other processing system, including those available from other manufacturers, may be adapted to practice the implementations described herein.

The substrate processing system 132 includes a process chamber 100 coupled to a gas panel 130 and a controller 110. The process chamber 100 generally includes a top wall 124, a sidewall 101 and a bottom wall 122 that define a processing volume 126. A support pedestal 150 is provided in the processing volume 126 of the process chamber 100. The support pedestal 150 is supported by a stem 160 and may be typically fabricated from aluminum, ceramic, and other suitable materials. The support pedestal 150 may be moved in a vertical direction inside the process chamber 100 using a displacement mechanism (not shown).

The support pedestal 150 may include a heater element 170 suitable for controlling the temperature of a substrate 190 supported on a surface 192 of the support pedestal 150. The heater element 170 may be embedded in the support pedestal 150. The support pedestal 150 may be resistively heated by applying an electric current from a power supply 106 to the heater element 170. The heater element 170 may be made of a nickel-chromium wire encapsulated in a nickel-iron-chromium alloy (e.g., INCOLOY®) sheath tube. The electric current supplied from the power supply 106 is regulated by the controller 110 to control the heat generated by the heater element 170, thus maintaining the substrate 190 and the support pedestal 150 at a substantially constant temperature during film deposition. The supplied electric current may be adjusted to selectively control the temperature of the support pedestal 150 between about 100 degrees Celsius to about 700 degrees Celsius.

A temperature sensor 172, such as a thermocouple, may be embedded in the support pedestal 150 to monitor the temperature of the support pedestal 150 in a conventional manner. The measured temperature is used by the controller 110 to control the power supplied to the heater element 170 to maintain the substrate at a desired temperature.

A vacuum pump 102 is coupled to a port formed in the bottom of the process chamber 100. The vacuum pump 102 is used to maintain a desired gas pressure in the process chamber 100. The vacuum pump 102 also evacuates post-processing gases and by-products of the process from the process chamber 100.

The substrate processing system 132 may further include additional equipment for controlling the chamber pressure, for example, valves (e.g. throttle valves and isolation valves) positioned between the process chamber 100 and the vacuum pump 102 to control the chamber pressure.

A showerhead 120 having a plurality of apertures 128 is disposed on the top of the process chamber 100 above the support pedestal 150. The apertures 128 of the showerhead 120 are utilized to introduce process gases into the process chamber 100. The apertures 128 may have different sizes, number, distributions, shape, design, and diameters to facilitate the flow of the various process gases for different process conditions. The showerhead 120 is connected to the gas panel 130 that allows various gases to supply to the processing volume 126 during processing. A plasma is formed from the process gas mixture exiting the showerhead 120 to enhance thermal decomposition of the process gases resulting in the deposition of material on a surface 191 of the substrate 190.

The showerhead 120 and the support pedestal 150 may form a pair of spaced apart electrodes in the processing volume 126. One or more RF power sources 140 provide a bias potential through a matching network 138 to the showerhead 120 to facilitate generation of plasma between the showerhead 120 and the support pedestal 150. Alternatively, the RF power sources 140 and matching network 138 may be coupled to the showerhead 120, the support pedestal 150, or coupled to both the showerhead 120 and the support pedestal 150, or coupled to an antenna (not shown) disposed exterior to the process chamber 100. In one implementation, the RF power sources 140 may provide between about 100 Watts and about 3,000 Watts at a frequency of about 50 kHz to about 13.6 MHz. In another implementation, the RF power sources 140 may provide between about 500 Watts and about 1,800 Watts at a frequency of about 50 kHz to about 13.6 MHz.

The controller 110 includes a central processing unit (CPU) 112, a memory 116, and a support circuit 114 utilized to control the process sequence and regulate the gas flows from the gas panel 130. The CPU 112 may be of any form of a general-purpose computer processor that may be used in an industrial setting. The software routines can be stored in the memory 116, such as random access memory, read only memory, floppy, or hard disk drive, or other form of digital storage. The support circuit 114 is conventionally coupled to the CPU 112 and may include cache, clock circuits, input/output systems, power supplies, and the like. Bi-directional communications between the controller 110 and the various components of the substrate processing system 132 are handled through numerous signal cables collectively referred to as signal buses 118, some of which are illustrated in FIG. 1.

The quantity/percentage of boron in the as-deposited boron-doped amorphous silicon film may vary from application to application. In various implementations of the present disclosure, the boron-doped amorphous silicon film may contain at least 1, 5, 8, 10, 15, 20, 25, 30, 35, 40, 45, 50, 55, 60, or 65 atomic percentage of boron. The boron-doped amorphous silicon film may contain up to 5, 8, 10, 15, 20, 25, 30, 35, 40, 45, 50, 55, 60, 65 or 70 atomic percentage of boron. The boron-doped amorphous silicon film may contain from about 1 to about 70 atomic percentage of boron. The boron-doped amorphous silicon film may contain from about 30 to about 60 atomic percentage of boron. The boron-doped amorphous silicon film may contain at least 20, 25, 30, 35, 40, 45, 50, 55, 60, 65, 70, 75, 80, 85, 90, or 95 atomic percentage of silicon. The boron-doped amorphous silicon film may contain up to 25, 30, 35, 40, 45, 50, 55, 60, 65, 70, 75, 80, 85, 90, 95, or 99 atomic percentage of silicon. The boron-doped amorphous silicon film may contain from about 20 to about 99 atomic percentage of silicon, for example about 35 to about 50 atomic percentage of silicon. The boron-doped amorphous silicon film may contain at least 10, 15, 20, 25 atomic percentage of hydrogen. The boron-doped amorphous silicon film may contain up to 15, 20, 25, 30, or 40 atomic percentage of hydrogen. The boron-doped amorphous silicon film may contain from about 10 to about 25 atomic percentage of hydrogen. In certain implementations where nitrogen is used as a precursor, the boron-doped amorphous silicon film may contain at least 5, 10, or 15 atomic percentage of nitrogen. The boron-doped amorphous silicon film may contain up to 10, 15, or 20 atomic percentage of nitrogen. The boron-doped amorphous silicon film may contain from about 5 to about 20 atomic percentage of hydrogen.

In general, the following exemplary deposition process parameters may be used to form the boron-doped amorphous silicon layer. The wafer temperature may range from about 80° C. to about 600° C. (e.g., from about 200° C. to about 600° C.; from about 300° C. to about 550° C. between; or from about 400° C. to about 500° C.). The chamber pressure may range from a chamber pressure of about 100 mTorr to about 200 Torr (e.g., about 1 Torr to about 100 Torr; about 2 Torr to about 60 Torr; between about 2 Torr and about 10 Torr). The flow rate of the silicon-containing gas mixture may be from about 100 sccm to about 5,000 sccm, for example, between about 100 sccm and about 1,200 sccm. The flow rate of a dilution gas may individually range from about 0 sccm to about 20,000 sccm, for example from about 2,000 sccm to about 10,000 sccm. The flow rate of an inert gas may individually range from about 0 sccm to about 20,000 sccm, for example from about 200 sccm to about 2,000 sccm. The flow rate of the boron-containing gas mixture may be from about 10 sccm to about 1,000 sccm, for example, between about 50 sccm and about 800 sccm.

In some implementations where plasma is present, an RF power of between about 1 W/in$^2$ and about 100 W/in$^2$, such as between about 3 W/in$^2$ and about 20 W/in$^2$, and a plate spacing of between about 200 mils to about 600 mils between the top surface of the substrate and the showerhead is used. The boron-doped amorphous silicon layer may be deposited to a thickness between about 5 Å and about 20,000 Å (e.g., between about 300 Å to about 5,000 Å; between about 5 Å to about 200 Å). The above process parameters provide a typical deposition rate for the boron-doped amorphous silicon layer in the range of about 100 Å/min to about 10,000 Å/min and can be implemented on a 300 mm substrate in a deposition chamber available from Applied Materials, Inc. of Santa Clara, Calif.

The as-deposited boron-doped amorphous silicon film may have a uniformity (R/2%) of less than 2.0%. The as-deposited boron-doped amorphous silicon film may have a refractive index (RI (633 nm)) of greater than 1.8, for example approximately 3.56. The as-deposited boron-doped amorphous silicon film may have a k-value (K (at 633 nm)) greater than 0.1, for example, approximately 0.36. The as-deposited boron-doped amorphous silicon film may have a stress (MPa) of from about −500 MPa to about 500 MPa, for example −50 MPa. The as-deposited boron-doped amorphous silicon film may have a density (g/cc) of greater than 1.5 g/cc, for example approximately 1.86 g/cc or higher such as 2.2 g/cc.

Figure 2:
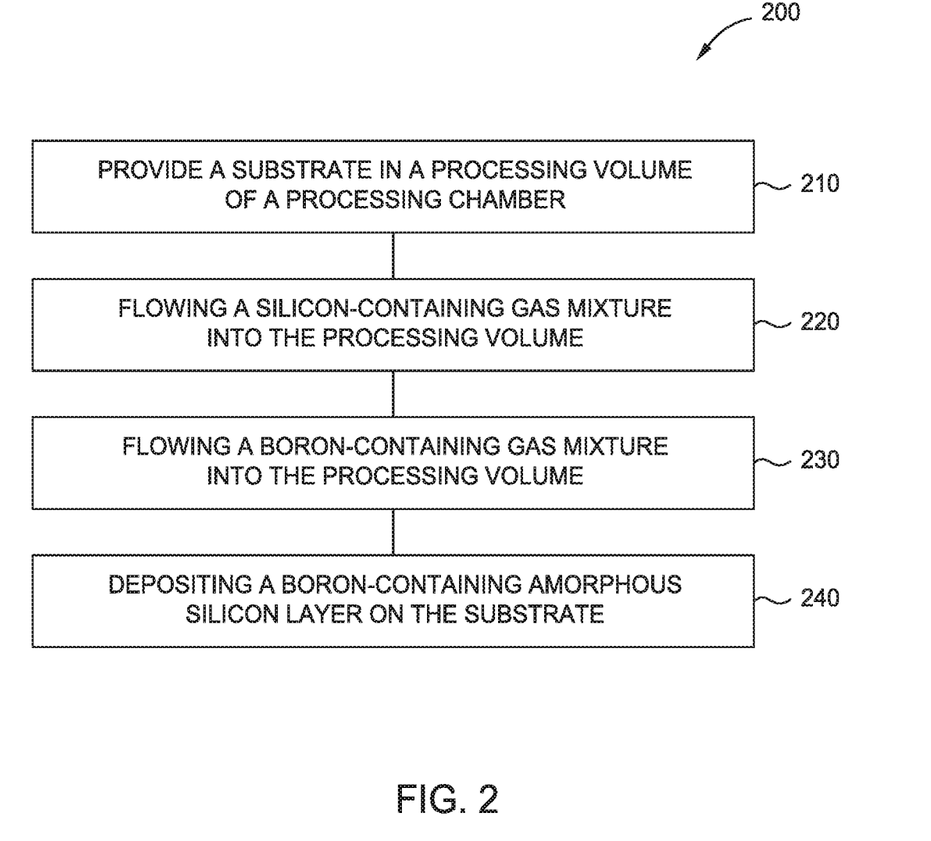
FIG. 2 is a process flow diagram depicting one implementation of a method for depositing a boron-doped amorphous silicon film according to implementations described herein.
Figure 3:
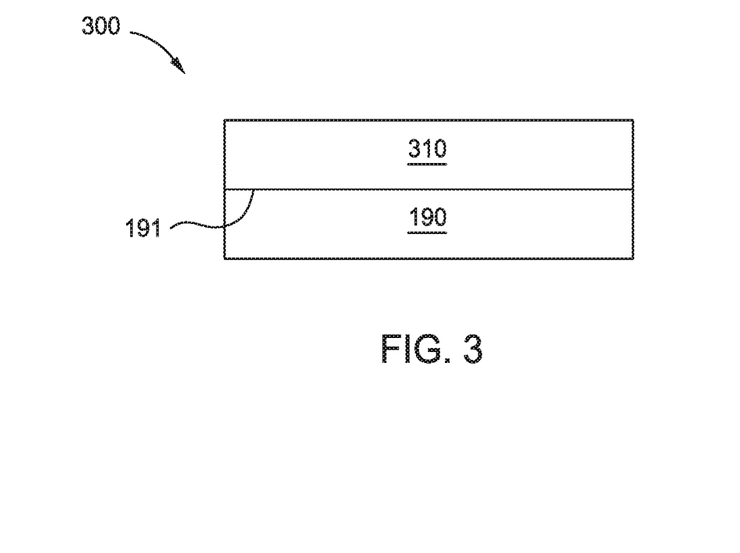
FIG. 3 depicts a schematic cross-sectional view of a workpiece with a boron-doped amorphous silicon layer deposited on a substrate according to implementations described herein.

FIG. 2 is a process flow diagram depicting one implementation of a method 200 for depositing a boron-doped amorphous silicon film according to implementations described herein. FIG. 3 illustrates a schematic cross-sectional view of a workpiece 300 after deposition of the boron-doped amorphous silicon film. The deposition can occur with or without plasma. The deposition can occur via a thermal CVD process or a PECVD process. The method 200 begins at operation 210 by providing a substrate in a processing volume of a processing chamber. The processing chamber may be the process chamber 100 depicted in FIG. 1. The substrate may be substrate 190. In one implementation, the surface 191 of the substrate 190 is substantially planar. Alternatively, the substrate 190 may have patterned structures, a surface having trenches, holes, or vias formed therein. The substrate 190 may also have a substantially planar surface having a structure formed thereon or therein at a desired elevation. While the substrate 190 is illustrated as a single body, it is understood that the substrate 190 may contain one or more materials used in forming semiconductor devices such as metal contacts, trench isolations, gates, bitlines, or any other interconnect features. The substrate 190 may comprise one or more metal layers, one or more dielectric materials, semiconductor materials, and combinations thereof utilized to fabricate semiconductor devices. For example, the substrate 190 may include an oxide material, a nitride material, a polysilicon material, or the like, depending upon the desired application. In one implementation, the substrate 190 comprises at least one of silicon oxide, silicon nitride, silicon-oxygen-carbon-nitride (SiOCN), polysilicon, and amorphous carbon.

In one implementation where a memory application is desired, the substrate 190 may include the silicon substrate material, an oxide material, and a nitride material, with or without polysilicon sandwiched in between. In another implementation, the substrate 190 may include a plurality of alternating oxide and nitride materials (i.e., oxide-nitride-oxide (ONO)) deposited on a surface of the substrate (not shown). In various implementations, the substrate 190 may include a plurality of alternating oxide and nitride materials, one or more oxide or nitride materials, polysilicon or amorphous silicon materials, oxides alternating with amorphous carbon, oxides alternating with polysilicon, undoped silicon alternating with doped silicon, undoped polysilicon alternating with doped polysilicon, or undoped amorphous silicon alternating with doped amorphous silicon. The substrate may be any substrate or material surface upon which film processing is performed. For example, the substrate 190 may be a material such as crystalline silicon, silicon oxide, silicon oxynitride, silicon nitride, strained silicon, silicon germanium, tungsten, titanium nitride, doped or undoped polysilicon, doped or undoped silicon wafers and patterned or non-patterned wafers, silicon on insulator (SOI), carbon doped silicon oxides, silicon nitrides, doped silicon, germanium, gallium arsenide, glass, sapphire, low k dielectrics, and combinations thereof.

At operation 220, a silicon-containing gas mixture is flowed into the processing volume 126. The silicon-containing gas mixture may be flowed from the gas panel 130 into the processing volume 126 through the showerhead 120. The silicon-containing gas mixture may include at least one silicon-containing source gas and optionally an inert gas and/or dilution gas. In one implementation, the silicon-containing source gas mixture is a silane-containing source gas mixture. In one implementation, the silicon-containing source gas is silane. Examples of suitable silanes include silane ($SiH_4$) and higher-order silanes with the empirical formula $Si_aH_{(2a+2)}$ wherein a=1, 2, 3, 4, . . . , such as disilane ($Si_2H_6$), trisilane ($Si_3H_5$) and tetrasilane ($Si_4H_{10}$), as well as others. In one implementation, the silane-containing gas mixture comprises one or more silane-containing compounds selected from the group consisting of silane ($SiH_4$), disilane ($Si_2H_6$), trisilane ($Si_3H_5$) and tetrasilane ($Si_4H_{10}$), and combinations thereof.

In some implementations, the silicon-containing gas mixture further includes an inert gas or dilution gas. Suitable dilution gases include helium (He), argon (Ar), hydrogen ($H_2$), nitrogen ($N_2$), ammonia ($NH_3$), or combinations thereof, among others. In some implementations, Ar, He, and $N_2$ are used to control the density and deposition rate of the boron-doped amorphous silicon layer. In some implementations, the addition of $N_2$ and/or $NH_3$ can be used to control the hydrogen ratio of the amorphous silicon layer. Alternatively, dilution gases may not be used during the deposition.

Suitable inert gases, such as argon (Ar) and/or helium (He) may be supplied with the silicon-containing gas mixture into the process chamber 100. Other inert gases, such as nitrogen ($N_2$) and nitric oxide (NO), may also be used to control the density and deposition rate of the boron-doped amorphous silicon layer. Additionally, a variety of other processing gases may be added to the gas mixture to modify properties of the amorphous silicon material. In one implementation, the processing gases may be reactive gases, such as hydrogen ($H_2$), ammonia ($NH_3$), a mixture of hydrogen ($H_2$) and nitrogen ($N_2$), or combinations thereof. The addition of $H_2$ and/or $NH_3$ may be used to control the hydrogen ratio (e.g., silicon to hydrogen ratio) of the deposited amorphous silicon layer. Not to be bound by theory, but it is believed that the hydrogen ratio present in the boron-doped amorphous silicon film provides control over layer properties, such as reflectivity.

At operation 230, a boron-containing gas mixture is flowed into the processing volume 126. The boron-containing gas mixture may be flowed from the gas panel 130 into the processing volume 126 through the showerhead 120. In one implementation, the boron-containing gas mixture is a borane-containing gas mixture. In one implementation, the boron-containing gas mixture comprises a boron-containing compound and optionally a dilution gas and/or an inert gas. Examples of suitable boron-containing compounds include diborane ($B_2H_6$), dimethylamine borane (DMAB or [NH($CH_3$)$_2$BH$_3$]), trimethylborane (TMB or B($CH_3$)$_3$), triethylborane (TEB), combinations thereof and similar compounds. In one implementation, the borane-containing gas mixture comprises one or more borane-containing compounds selected from the group consisting of diborane ($B_2H_6$), dimethylamine borane ([NH($CH_3$)$_2$BH$_3$]), trimethylborane (B($CH_3$)$_3$), triethylborane (TEB), and combinations thereof. In one implementation, the boron-containing gas mixture comprises diborane.

In one implementation, the percentage of boron-containing compound in the total boron-containing gas mixture is from about 2% to about 20%. In another implementation, the percentage of boron-containing compound in the total boron-containing gas mixture is from about 5% to about 10%. Exemplary boron-containing gas mixtures may include 5% $B_2H_6$/95% $N_2$, 5% $B_2H_6$/95% He, 10% $B_2H_6$/90% He, 5% $B_2H_6$/95% Ar, 10% $B_2H_6$/90% Ar, or 5% $B_2H_6$/95% $H_2$. It is contemplated that when different concentrations of boron-containing gas mixtures are used, the flow rate to achieve certain film properties may change accordingly. For example in case where 5% diborane is used as the boron-containing gas source, the flow rate of the boron-containing gas mixture may be from about 20 sccm to about 5000 sccm, for example, about 200 sccm. In one another example where 10% diborane is used as the boron-containing gas source, the flow rate of the boron-containing gas mixture may be from about 10 sccm to about 3000 sccm, for example about 50 sccm to about 800 sccm.

At operation 240, a boron-doped amorphous silicon film 310 is deposited on the substrate 190. The deposition can occur either in the presence of plasma or without plasma (plasma-free process). In some implementations where plasma is used, an RF plasma is generated in the processing volume 126 to deposit a boron-doped amorphous silicon film on the substrate 190. FIG. 2 herein shows one implementation where the silicon-containing gas mixture and the boron-containing gas mixture are introduced into the processing volume 126 before turning on the RF plasma. In such a case, the silicon-containing gas mixture may be introduced into the processing volume 126 for a longer time such as between about 5 seconds and about 30 seconds, for example about 15 seconds, which may vary depending upon the size of the substrate. The flowing of the silicon-containing gas mixture prior to the introduction of the boron-containing gas is believed to provide continuous thermal and pressure stabilization of the processing volume 126. In one implementation, while flowing the silicon-containing gas mixture, the boron-containing gas mixture is then introduced into the processing volume 126 for about 0.5 seconds to about 5 seconds, for example about 1 second to about 2 seconds (the flowing time may vary as long as the flow is long enough for the boron-containing gas mixture to reach the processing volume 126) prior to striking the RF plasma. The silicon-containing gas mixture and the boron-containing gas mixture may continue flow until a desired thickness of the boron-doped amorphous silicon film is reached. Alternatively, the RF plasma may be generated prior to introduction of the silicon-containing gas mixture and/or the boron-containing gas mixture into the processing volume 126.

It should also be understood that in some implementations, operation 220, operation 230 and operation 240 may occur sequentially, simultaneously, partially overlap, or occur in a different order. For example, in some implementations, the boron-containing gas mixture of operation 230 is introduced into the processing volume prior to flowing the silicon-containing gas mixture of operation 220.

In implementations without plasma, the silicon-containing gas mixture and the boron-containing gas mixture are typically heated to deposit the boron-doped amorphous silicon layer on the substrate 190.

The thickness of the boron-doped amorphous silicon film 310 is variable depending upon the stage of processing. In one implementation for etch stop applications, the boron-doped amorphous silicon film may have a thickness from about 20 Å and about 200 Å (e.g., from about 20 Å to about 100 Å; from about 30 Å to about 50 Å). In one implementation for spacer applications, the boron-doped amorphous silicon film may have a thickness from about 20 Å and about 500 Å (e.g., from about 20 Å to about 100 Å; from about 30 Å to about 50 Å). In another implementation, for hardmask applications, the boron-doped amorphous silicon film may have a thickness from about 100 Å and about 50,000 Å (e.g., from about 300 Å to about 5,000 Å; from about 1000 Å to about 2,000 Å). The boron-doped amorphous silicon film 310 may be patterned using a standard photoresist patterning techniques. The boron-doped amorphous silicon film 310 may be removed using a solution comprising, for example, tetramethylammonium hydroxide. The boron-doped amorphous silicon film may also be removed using etch chemistries containing oxygen and halogens (e.g. fluorine or chlorine), for example, $Cl_2/O_2$, $F_4/O_2$, $Cl_2/O_2/CF_4$.

Figure 4:
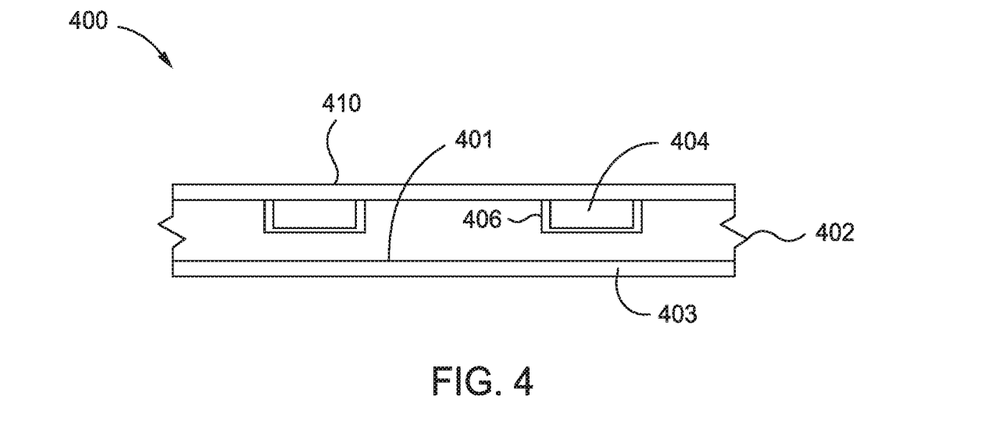
FIG. 4 depicts a schematic cross-sectional view of another workpiece with a boron-doped amorphous silicon layer deposited on a substrate according to implementations described herein.

FIG. 4 depicts a schematic cross-sectional view of another workpiece 400 with a boron-doped amorphous silicon layer (e.g., etch stop layer 410) deposited on a substrate 403 according to implementations described herein. The substrate 403 may be, among others, a thin sheet of metal, plastic, organic material, silicon, glass, quartz, or polymer materials. In one implementation, the substrate 403 is a silicon substrate upon which a silicon-containing dielectric is deposited. The substrate 403 may be circular, square or other shapes as known in the art.

The substrate 403 can have a dielectric layer 402 disposed over the substrate surface 401. Conductive contacts 404 are disposed within the dielectric layer 402 and are separated from the dielectric layer 402 by feature barrier layer(s) 406. The dielectric layer 402 contains a dielectric material, such as a low-k dielectric material. In one example, the dielectric layer 402 contains a low-k dielectric material, such as a silicon carbide oxide material or a carbon doped silicon oxide material, for example, BLACK DIAMOND® low-k dielectric material, available from Applied Materials, Inc., located in Santa Clara, Calif.

The feature barrier layer(s) 406 may be conformally deposited into the feature within the dielectric layer 402. The feature barrier layer(s) 406 may be formed or deposited by a physical vapor deposition (PVD) process, an atomic layer deposition (ALD) process, or a CVD process, and may have a thickness within a range from about 5 Å to about 50 Å, such as from about 10 Å to about 30 Å. The feature barrier layer(s) 406 may contain titanium, titanium nitride, tantalum, tantalum nitride, tungsten, tungsten nitride, silicides thereof, derivatives thereof, or combinations thereof. In some implementations, the feature barrier layer(s) 406 may contain a tantalum/tantalum nitride bilayer or titanium/titanium nitride bilayer. In one example, the feature barrier layer(s) 406 can contain tantalum nitride and metallic tantalum layers deposited by PVD processes. The conductive contacts 404 may be a metal, such as copper.

The etch stop layer 410 may be formed according to method 200 described in FIG. 2. The etch stop layer 410 can be between about 10 Å and about 100 Å thick, such as between about 20 Å and about 50 Å thick. In one implementation, the etch stop layer 410 is 20 Å thick.

Parameters for deposition of the silicon and aluminum containing layer can include maintaining the process region at a pressure from about 2 Torr to about 60 Torr, such as from about 2 to about 10 Torr. The temperature of the process region and the substrate can be maintained from about 200 degrees Celsius to about 600 degrees Celsius, such as from about 300 to about 550 degrees Celsius. The silicon-containing precursor (e.g., $SiH_4$) can be delivered at a flow rate from about 100 standard cubic centimeters per minute (sccm) to about 1,200 sccm in a carrier gas at a flow rate from about 100 sccm to about 20,000 sccm. In one implementation, the silicon-containing precursor is delivered at a flow rate from about 100 sccm to about 500 sccm in an optional carrier gas flow from about 500 sccm to about 10,000 sccm. In one implementation, the boron-containing precursor (e.g., $B_2H_6$) can be delivered at a flow rate from about 50 sccm to about 800 sccm in an optional carrier gas flow from about 250 sccm to about 10,000 sccm. The aluminum-containing precursor can be delivered at a flow rate from about 1 sccm to about 500 sccm in a carrier gas flow from about 10 sccm to about 5,000 sccm.

EXAMPLES

The following non-limiting examples are provided to further illustrate implementations described herein. However, the examples are not intended to be all inclusive and are not intended to limit the scope of the implementations described herein.

TABLE I

| Film No. | Underlayer | Film | Dep Temp | Adhesion | Bubbles Wafer/bevel |
|---|---|---|---|---|---|
| 1. | Bare silicon + native oxide | 5 kÅ 40% B-aSi | 480° C. | Ok | None (SEM) |
|  |  | 5 kÅ 77% B-aSi | 480° C. | Ok | None (SEM) |
| 2. | 40% B-aSi on 1 kÅ SUSG | 100 Å a-Si | 400° C. | Ok |  |
| 3. | 77% B-aSi on 1 kÅ SUSG | 100 Å a-Si | 400° C. | Ok | FIB confirmed hump defect (Not bubble) |
| 4. | 1 kÅ 40% B-aSi on 1 kÅ SUSG | 1 kÅ 40% B-aSi | 480° C. | Ok |  |
| 5. | 1 kÅ nitride (SEC) | Undoped a-Si 480° C., no $NH_3$ treatment | 480° C. | Ok | bubbles |

Table I depicts the adhesion and bubble results for several films deposited according to implementations described herein.

Figure 5:
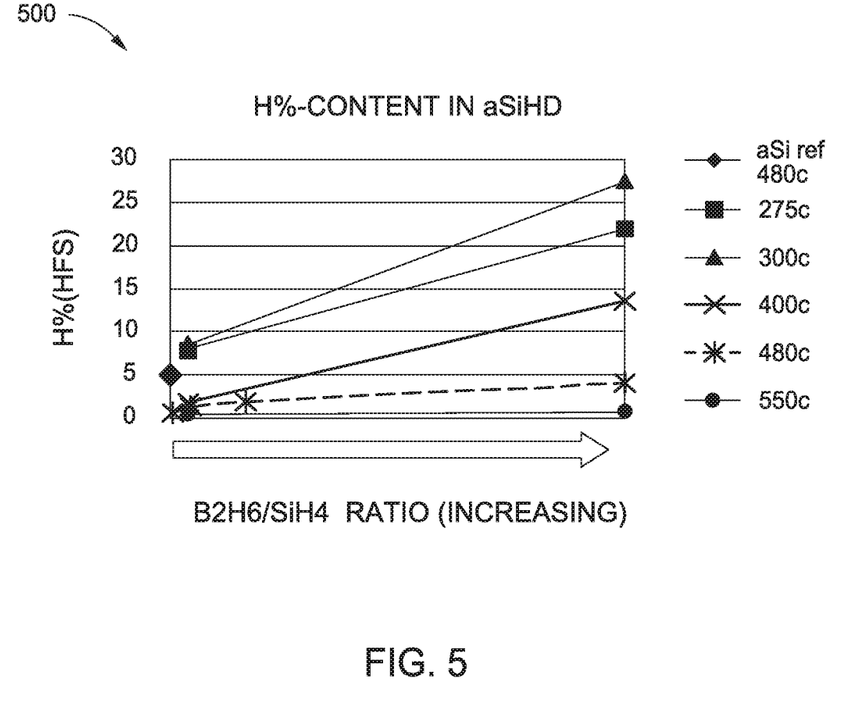
FIG. 5 is a plot depicting the hydrogen percent for various boron-doped amorphous silicon films formed according to implementations described herein.

FIG. 5 is a plot depicting the hydrogen percent for various boron-doped amorphous silicon films formed according to implementations described herein. The x-axis depicts the ratio of diborane to silane. The y-axis depicts atomic percent of hydrogen. The reference film, which was PECVD a-silicon deposited at 480 degrees Celsius, had had an atomic percentage of hydrogen of about 5%. Boron-doped amorphous silicon films deposited according to implementations described herein at 480 degrees Celsius and 550 degrees Celsius demonstrated a lower atomic percentage of hydrogen when compared with the prior art PECVD a-silicon deposited at 480 degrees Celsius.

In summary, borane can greatly reduce the energy barrier during the decomposition of silane and alkylsilane species. The resulting boron-doped amorphous silicon film formed according to implementations described herein demonstrates reduced bubbling, improved particle reduction, and a lower hydrogen content relative to currently available amorphous silicon films deposited via conventional PECVD processes. Not to be bound by theory, but it is believed that the lower hydrogen content of the boron-doped amorphous silicon films of the preset disclosure promotes bubble free growth and good adhesion to a substrate.

When introducing elements of the present disclosure or exemplary aspects or implementation(s) thereof, the articles "a," "an," "the" and "said" are intended to mean that there are one or more of the elements.

The terms "comprising," "including" and "having" are intended to be inclusive and mean that there may be additional elements other than the listed elements.

While the foregoing is directed to implementations of the present disclosure, other and further implementations of the disclosure may be devised without departing from the basic scope thereof, and the scope thereof is determined by the claims that follow.

The invention claimed is:

1. A method, comprising:
   generating a pressure within a processing volume between 2 Torr and 60 Torr;
   heating a substrate in the processing volume to a temperature between 300 degrees Celsius and 550 degrees Celsius;
   flowing a silane-containing gas mixture into the processing volume having the substrate positioned therein;
   flowing a borane-containing gas mixture at a flow rate between about 10 sccm to about 1000 sccm into the processing volume having the substrate positioned therein; and
   depositing a boron-doped amorphous silicon layer on the substrate, the boron-doped amorphous silicon layer having 40 atomic percentage of hydrogen or less.

2. The method of claim 1, wherein the borane-containing gas mixture comprises one or more borane-containing compounds selected from the group consisting of: diborane ($B_2H_6$), dimethylamine borane ($[NH(CH_3)_2BH_3]$), trimethylborane ($B(CH_3)_3$), triethylborane (TEB), and combinations thereof.

3. The method of claim 1, wherein the silane-containing gas mixture comprises one or more silane-containing compounds selected from the group consisting of: silane ($SiH_4$), disilane ($Si_2H_6$), trisilane ($Si_3H_8$) and tetrasilane ($Si_4H_{10}$), and combinations thereof.

4. The method of claim 3, wherein the depositing a boron-doped amorphous silicon layer on the substrate is performed using a thermal chemical vapor deposition process comprising heating the substrate to a temperature between about 480 degrees Celsius and about 550 degrees Celsius.

5. The method of claim 1, wherein the substrate comprises at least one of silicon oxide, silicon nitride, silicon-oxygen-carbon-nitride (SiOCN), polysilicon, and amorphous carbon.

6. The method of claim 1, wherein the substrate comprises a plurality of alternating oxide and nitride materials, one or more oxide materials or nitride materials, polysilicon or amorphous silicon materials, oxides alternating with amorphous silicon, oxides alternating with polysilicon, undoped silicon alternating with doped silicon, undoped polysilicon alternating with doped polysilicon, or undoped amorphous silicon alternating with doped amorphous silicon.

7. The method of claim 1, wherein the boron-doped amorphous silicon layer is an etch stop layer having a thickness from about 5 Å to about 200 Å.

8. The method of claim 1, wherein the boron-doped amorphous silicon layer is a hardmask having a thickness from about 300 Å to about 5,000 Å.

9. The method of claim 1, the boron-doped amorphous silicon layer having 25 atomic percentage of hydrogen or less.

10. The method of claim 1, the boron-doped amorphous silicon having 15 atomic percentage of hydrogen or less.

11. A method, comprising:
    generating a pressure within a processing volume between 2 Torr and 60 Torr;
    heating a substrate in the processing volume to a temperature between 300 degrees Celsius and 550 degrees Celsius;
    flowing a first gas mixture comprising silane gas ($SiH_4$) into the processing volume having the substrate positioned therein;
    flowing a second gas mixture comprising diborane ($B_2H_6$) at a flow rate between about 10 sccm to about 1000 sccm into the processing volume having the substrate positioned therein; and
    depositing a boron-doped amorphous silicon layer on the substrate, the boron-doped amorphous silicon layer having 40 atomic percentage of hydrogen or less.

12. The method of claim 11, wherein the depositing a boron-doped amorphous silicon layer on the substrate is performed using a thermal chemical vapor deposition process comprising heating the substrate to a temperature between about 480 degrees Celsius and about 550 degrees Celsius.

13. The method of claim 11, wherein the substrate comprises at least one of silicon oxide, silicon nitride, silicon-oxygen-carbon-nitride (SiOCN), polysilicon, and amorphous carbon.

14. The method of claim 11, wherein the substrate comprises a plurality of alternating oxide and nitride materials, one or more oxide materials or nitride materials, polysilicon or amorphous silicon materials, oxides alternating with amorphous silicon, oxides alternating with polysilicon, undoped silicon alternating with doped silicon, undoped polysilicon alternating with doped polysilicon, or undoped amorphous silicon alternating with doped amorphous silicon.

15. The method of claim 11, wherein the boron-doped amorphous silicon layer is an etch stop layer having a thickness from about 5 Å to about 200 Å.

16. The method of claim 11, wherein the boron-doped amorphous silicon layer is a hardmask having a thickness from about 300 Å to about 5,000 Å.

17. A method, comprising:
    generating a pressure within a processing volume between 2 Torr and 60 Torr;
    heating a substrate in the processing volume to a temperature between 300 degrees Celsius and 550 degrees Celsius, wherein the substrate comprises:
    a dielectric layer; and
    conductive contacts disposed within the dielectric layer and separated from the dielectric layer by barrier layers;
    flowing a silane-containing gas mixture into the processing volume having the substrate positioned therein;
    flowing a borane-containing gas mixture at a flow rate between about 10 sccm to about 1000 sccm into the processing volume having the substrate positioned therein; and
    depositing a boron-doped amorphous silicon layer on the substrate, the boron-doped amorphous silicon layer having 40 atomic percentage of hydrogen or less.

18. The method of claim 17, wherein the borane-containing gas mixture comprises one or more borane-containing compounds selected from the group consisting of: diborane ($B_2H_6$), dimethylamine borane ($[NH(CH_3)_2BH_3]$), trimethylborane ($B(CH_3)_3$), triethylborane (TEB), and combinations thereof.

19. The method of claim 18, wherein the silane-containing gas mixture comprises one or more silane-containing compounds selected from the group consisting of: silane ($SiH_4$), disilane ($Si_2H_6$), trisilane ($Si_3H_8$) and tetrasilane ($Si_4H_{10}$), and combinations thereof.

20. The method of claim 19, wherein the depositing a boron-doped amorphous silicon layer on the substrate is performed using a thermal chemical vapor deposition process.

\* \* \* \* \*

UNITED STATES PATENT AND TRADEMARK OFFICE
CERTIFICATE OF CORRECTION

PATENT NO. : 10,593,543 B2
APPLICATION NO. : 15/976945
DATED : March 17, 2020
INVENTOR(S) : Milind Gadre et al.

Page 1 of 1

It is certified that error appears in the above-identified patent and that said Letters Patent is hereby corrected as shown below:

In the Specification

In Column 7, Line 18, delete "$(Si_3H_5)$" and insert -- $(Si_3H_8)$ --, therefor.

In Column 7, Line 22, delete "$(Si_3H_5)$" and insert -- $(Si_3H_8)$ --, therefor.

Signed and Sealed this
Twelfth Day of May, 2020

Andrei Iancu
*Director of the United States Patent and Trademark Office*